United States Patent [19]

Snyder et al.

[11] 4,063,222

[45] Dec. 13, 1977

[54] SELECTIVE ERASURE OF IMAGE RECORDING DEVICES

[75] Inventors: Jan S. Snyder, Upland, Calif.; Clark I. Bright, Kula Kai, Hawaii

[73] Assignee: Xerox Corporation, Stamford, Conn.

[21] Appl. No.: 650,825

[22] Filed: Jan. 21, 1976

[51] Int. Cl.[2] ....................... G03G 16/00; G11C 11/42

[52] U.S. Cl. ....................................... 365/126; 365/112

[58] Field of Search .................... 340/173 TP, 173 LS, 340/173 CR; 96/1.1, 1.5

[56] References Cited

U.S. PATENT DOCUMENTS

| | | | |
|---|---|---|---|
| 3,526,879 | 9/1970 | Gundlach et al. | 340/173 TP |
| 3,795,514 | 3/1974 | Jvirblis et al. | 340/173 TP |
| 3,906,462 | 9/1975 | Fernlab et al. | 340/173 LS |
| 3,980,476 | 9/1976 | Wysocki | 340/173 TP |

*Primary Examiner*—Vincent P. Canney

*Attorney, Agent, or Firm*—James J. Ralabate; Franklyn C. Weiss; Allen S. Melser

[57] ABSTRACT

Method and apparatus for selectively erasing information formed on the surface of image recording device which deforms when illuminated in the presence of an electrostatic field applied thereacross. The image recording device, comprising a layered structure consisting of a conductive transparent substrate, a photoconductive layer, a deformable elastomer layer and a deformable electrode, is initially raster scanned by information containing light on the photoconductor layer with voltage applied between the conductive electrodes whereby the elastomer and deformable electrode are deformed in accordance with the input information. For selective erasure, the voltage is removed and the device is short-circuited. With the device shorted, the area to be erased is scanned with the spot of light. The short is then removed and the voltage reapplied, the remainder of the information except for the area erased, being restored. Additional information can be written in the erased area if desired.

26 Claims, 6 Drawing Figures

SELECTIVE ERASURE OF IMAGE RECORDING DEVICES

BACKGROUND OF THE INVENTION

A solid-state cyclic image recording device which has a layered structure consisting of a conductive transparent substrate, a thin photoconductive layer, a thin deformable elastomer layer and a deformable electrode such as a thin flexible metal layer has been disclosed in U.S. Pat. No. 3,716,359. When an electric field is placed between the conductive substrate and the deformable electrode, the elastomer will deform into a diffracting surface relief pattern corresponding to the image light distribution of an image focused on the photoconductive layer. Light modulated by the deformation of the elastomer surface can be converted to an intensity distribution similar to the original image by means of a simple Schleiren optics system. As described in the article "The Ruticon Family of Eraseable Image Recording Devices", N. K. Sheridon, IEEE Transitions on Electron Devices, ED-19, September 1972, pages 1003 to 1010, the image recording device, modified to incorporate a Ronchi ruling on the conductive substrate before the photoconductive layer and referred to in the article as a Ruticon, may be utilized as an optical buffer storage device. The optical buffer storage device may be utilized in a word processing system to temporarily store information thereon. For example, in text editing systems commercially available, information to be printed as hard copy is first displayed on a display device, such as a cathode ray tube, in a manner whereby corrections to a line of text, for example, can be made to the information displayed prior to its reproduction in hard copy. A feature of text editing systems is that selected portions of the display can be edited. In the image recording device described in the aforementioned patent, selective erasive, or editing, of the image formed thereon has not been achieved. The entire image formed on the prior art cyclic image recording device of the type described hereinabove is erased by flooding the photoconductive layer with light or removing the field across the elastomer. Obviously, complete, instead of selective, erasure of the image is a device characteristic which substantially eliminates the usefulness of the device in a text editing system.

SUMMARY OF THE PRESENT INVENTION

The present invention provides method and apparatus for selectively erasing information formed on the surface of an imaging recording device which deforms when illuminated in the presence of an electrostatic field applied thereacross. The image recording device, comprising a layered structure consisting of a conductive transparent substrate, an optical grid, a photoconductive layer, a deformable elastomer layer and a deformable electrode, is initially raster scanned by information containing light on the photoconductive layer with voltage applied between the conductive electrodes whereby the elastomer and deformable electrode are deformed in accordance with the input information. For selective erasure, the voltage is removed and the device is shorted. With the device shorted, the area to be erased is scanned with the spot of light. The short is then removed and the voltage reapplied, the remainder of the information, except for the area erased, being restored. Additional information can be written in the erased area if desired.

It is an object of the present invention to provide method and apparatus for selectively editing and erasing information on the surface of an image recording device which deforms when illuminated in the presence of an electric field.

It is a further object of the present invention to provide a laser addressed display system wherein images formed on the surface of an image recording device which deforms when illuminated in the presence of an electric field may be selectively erased and additional information added in the areas erased.

It is still a further object of the present invention to provide method and apparatus for producing positive or negative images on a projection device, the projection device displaying images projected from the surface of an image recording device which deforms when illuminated in the presence of an electric field.

It is still an object of the present invention to provide a text editing display system wherein images formed on the surface of an image recording device which deforms when illuminated in the presence of an electric field may be selectively edited prior to reproducing the text as hard copy.

It is a further object of the present invention to provide an image storage buffer device which can be selectively erased and which is adapted for use in word processing and information storage systems.

DESCRIPTION OF THE DRAWING

For a better understanding of the invention and other objects and further features thereof, reference is made to the following description which is to be read in conjunction with the accompanying drawing wherein.

DESCRIPTION OF THE PREFERRED EMBODIMENT

Figure 1:
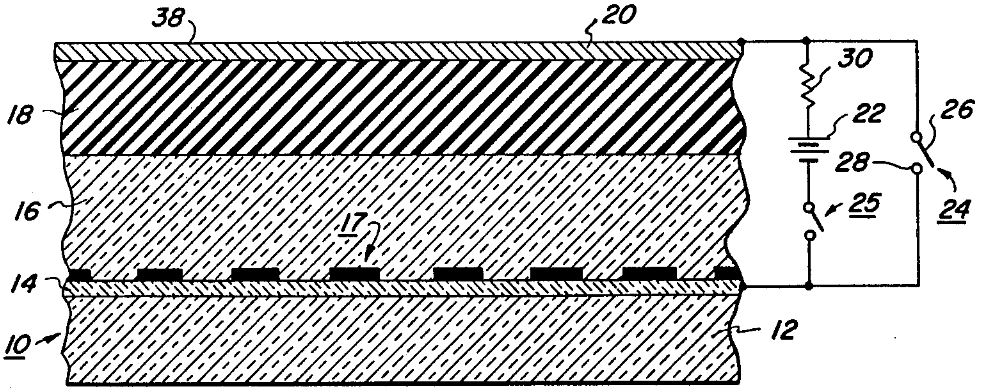
FIG. 1 is a side sectional view of the image recording device utilized in the present invention.

Referring now to FIG. 1, an image recording device 10 which may be utilized in the present invention is shown. A device similar to device 10 of FIG. 1 is described in U.S. Pat. No. 3,716,359 and the teachings therein necessary for the understanding of the present invention are incorporated herein by reference. In order to put the present invention in perspective, a brief discussion of the image recording device shown in FIG. 1 is set forth hereinafter. The apparatus of FIG. 1 includes a substrate 12 which is either conductive or is conductive on one surface thereof. In the preferred embodiment, substrate 12 is transparent and commonly comprises a commonly available NESA glass which comprises glass substrate 12 and a tin oxide layer 14. A photoconductive layer 16 overlies tin oxide layer 14 and is a material which will allow the passage of more electric charge in those regions which are exposed to light. The photoconductor must have a suitable spectral sensitivity or be responsive to reasonable exposures at the applied electric field strength used. To preserve good contrast in a stored image, it should have a low dark conductivity. Such a photoconductor may be a selenium based photoconductor or an organic photoconductor, such as poly-n-vinyl carbazole, mixed with a sensitizing dye to enhance response. The thickness of the photoconductive layer will probably range from 0.1 microns to 200 microns depending largely upon the spatial frequency of the information to be recorded. For operating convenience, an optical grid 17, such as a Ronchi ruling, comprising alternate opaque bars and spaces, preferably of equal widths, is placed on the conductive substrate 12 as shown. The opaque bars may comprise chromium although other metals may be used. An elastomer layer 18 overlies photoconductor 16 and is a class of elastomeric soft solid materials including both natural rubbers and synthetic polymers which have rubber like characteristics, i.e. are elastic and include materials such as styrene-butadiene, poly-butadience, neoprene, butyl, polyisoprene, nitrile and ethylene propylene rubbers. Preferred elastomers for use in this application include: water based gelatin gels and dimethyl-polysiloxane based silicone gels. These materials may be coated on the photoconductor as monomers and polymerized in place or they may be coated on the surface from solutions in volatile solvents which will evaporate and leave a thin uniform layer. In general, these materials should be reasonably good insulators, having volume resistivities in excess of $10^4$ ohm-centimeters. The preferred elastomer is a transparent composition comprising an elastomeric dimethylpolysiloxane silicone gel made by steps including combining about one part of Dow Corning No. 182, silicone resin potting compound and anywhere from about zero to about 30 parts of Dow Corning No. 200 dimethylpolysiloxane silicone oil. Suitable resins include transparent flexible organosilonane resins of the type described in U.S. Pat. No. 3,284,406 in which a major portion of the organic groups attached to silicon are methyl radicals.

The thickness of the elastomer layer will range from approximately 0.1 microns to approximately 2,000 microns, depending upon the spatial frequency of the information required. Various optical properties of the device may be enhanced by a suitable selection of the elastic modulus of the material used. For example, a stiffer elastomer will recover more rapidly from an image when the electric field is removed, that is, may be erased more quickly. On the other hand, a material having a low elastic modulus will be capable of greater deformations and hence greater optical modulation for a given value of electric field. A conductive layer 20 overlies elastomer 18 and is flexible enough to follow the deformation of the elastomer layer without added surface tension effects. It must be of sufficient optical density to prevent exposure of the photoconductor from the high intensity light utilized to readout the image deformation image on its surface. Conductive layer 20 may be a thin layer of gold or a thin layer of indium, or a combination of the two or other suitable metal layers and preferably have high opacity and reflectivity.

A source of positive potential 22 is applied between conductive layers 14 and 20 and has a value of voltage approximately between 1 and 25,000 volts depending upon the thickness and other characteristics of elastomer 16. The power supply 22 provides DC voltage of one polarity to form a deformation image on the surface of elastomer 18 and a corresponding image on the surface of conductive layer 20. The polarity required depends upon the nature of photoconductor 16. As shown in the figure, a switch 24, having contact arm 26 and contact 28, is provided to selectively short the conducting electrodes 14 and 20 when closed. When the contact arm 26 is positioned at contact 28, the voltage across the layered structure between electrodes 14 and 20 is substantially zero, the voltage supplied by source 22 appearing across resistor 30 if switch 25 is closed. As will be set forth in more detail hereinafter, the closure of switch 24 in combination with exposing selected areas of the photoconductive layer 16 through substrate 12 and electrode 14 enables text information or the image on the surface of layer 20 to be erased in the exposed areas.

In operation, the sandwich in FIG. 1 is, in a preferred embodiment, raster scanned by an information (image or text) containing laser light which is propagated through the substrate 12 if it is transparent. Initially, source 22 applies a field across layers 14 and 20 through switch 25 thereby creating an electric field across the photoconductor and elastomer combination. This electric field induces a flow of charge in those regions of the photoconductor between the bars (rulings) of grid 17 which are exposed to the laser light. The carriers are transported and stored at the photoconductor/elastomer interface effectively discharging the electric field in the photoconductor layer and shifting the major portion of the potential drop to the elastomer layer. The localized electric field concentration causes elastomer 18 and electrode 20 to deform between the bars (rulings) while no deformation occurs behind the opaque bars. This creates a diffracting type relief pattern corresponding to the image (test) light pattern produced by the scanning laser light. At this point, the deformation stops and becomes stable as long as the electric fields across the elastomer are maintained. The diffraction surface has the same spatial frequency as the rulings 17. Coherent light reflected from the diffraction surface is processed by a simple Schlieren type optical system as will be described hereinafter with reference to FIG. 2. It should be noted that other sources of scanning light can be utilized to write on member 10, including light produced by a flying cathode ray tube. As will be set forth hereinafter in more detail, the image may be erased by optically flooding the photoconductor while contact arm 26 is positioned at contact 28, i.e. zero voltage (a short) is applied across the layered structure between electrodes 14 and 20. This discharges the charge at the photoconductor elastomer interface. The bias may be reapplied and the device is ready for another image.

Figure 2:
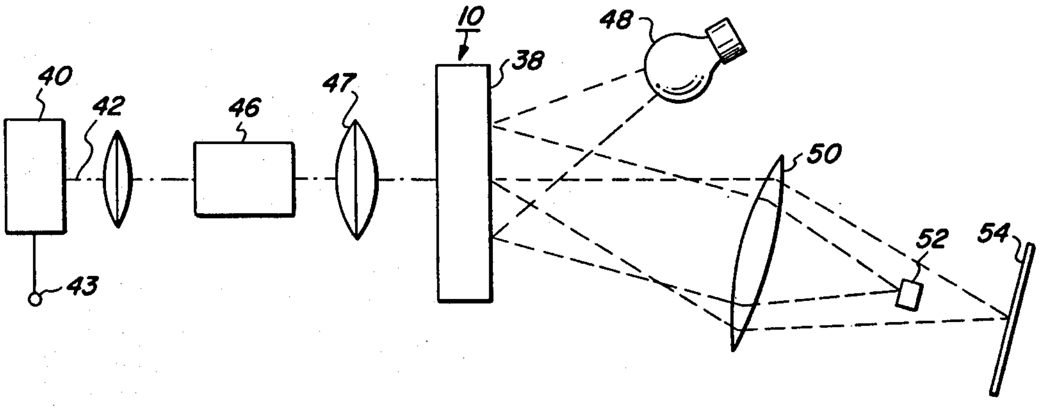
FIG. 2 is a schematic diagram of a system for recording information on the surface of the device shown in FIG. 1 and includes an optical system utilized to readout the image formed thereon.

FIG. 2 is a schematic diagram of a system for recording information on the device set forth in FIG. 1 and includes a Schlieren optical system for reading out an image formed on image recording device 10. In particular, an image, including textural information such as alphanumeric characters, are formed on the surface 38 of image recording device 10 by utilizing, in the preferred mode, a laser 40, which generates a coherent, monochromatic beam of light 42. The light beam is modulated in accordance with the information to be recorded by a video signal applied to input 43 and is expanded and focused by optical means 44 onto a scanner device 46 well known in the art. A lens 47 focuses the light from scanner 46 onto member 10. Readout lamp 48 is provided for illuminating surface 38 since device 10 requires an optical system to readout the stored images. With no exposure of the photoconductor, light from the undeformed thin film mirror surface 38 is brought to a focus via lens 50 on the zero-order stop 52 as shown. Stop 52 may comprises a small mirror and effectively is a positive spatial filter. After the photoconductor is exposed, the deformed electrode diffracts the light from readout lamp 48 around stop 52 and the stored image on surface 38 is reproduced by lens 50 at projection screen 54 which is located at the image plane of lens 50. A positive image is formed on projection screen 54, a positive image being defined as white characters (alphanumeric characters or other information) on a dark background. After it is determined that the image on surface 38 is the desired one, means can be provided to direct the image formed at the focal plane of lens 50 to a recording medium, such as film on a xerographic medium, whereby a hard copy of the projected image can be formed.

A negative image can be formed by tilting device 10 so the zero order is not blocked by stop 52 and by blocking the higher orders or by using a different spatial filter. However, this spatial filtering technique creates lower contrast between the dark characters and the light background.

In accordance with the teachings of the present invention, selective erasure or editing of an image formed on surface 38 is accomplished as follows. The voltage applied to member 10 by source 22 (FIG. 1) is removed by opening switch 25 and the device is shorted by closing switch 24. With the device shorted, a source, such as scanning laser 40 or a cathode ray tube, exposes an area on the photoconductor, corresponding to the image area on surface 38 which is to be erased, with an exposure of a predetermind intensity, thus selectively erasing the exposed area. The small electric field existent between the substrate 12 and the photoconductor/elastomer interface is sufficient that upon exposure by the scanning spot of light carriers generated in the photoconductor layer 16 travel to restore equilibrium, thereby discharging this region of the image on surface 38. The short is removed and the voltage is reapplied by opening switch 24 and closing switch 25 thereby restoring the remainder of the image (text information) except for the region erased by the spot of laser light. Additional information can be written in the erased space, if desired, by utilizing the normal image forming techniques set forth hereinabove. The advantage of selective erasure is the ability to edit (erase, update or change the information stored by the device) on projection screen 54 before the test is converted, or readout, in a hard copy format by techniques such as that shown in aforementioned U.S. Pat. No. 3,716,359. The erasure cycle time of the system (removing the bias, shorting the device and reapplying the bias) will be limited by the response of the image recording device itself and typically may be on the order of 0.010 seconds. The actual cycle time will be increased due to the time required to write (expose) the area to be erased.

Figure 3:
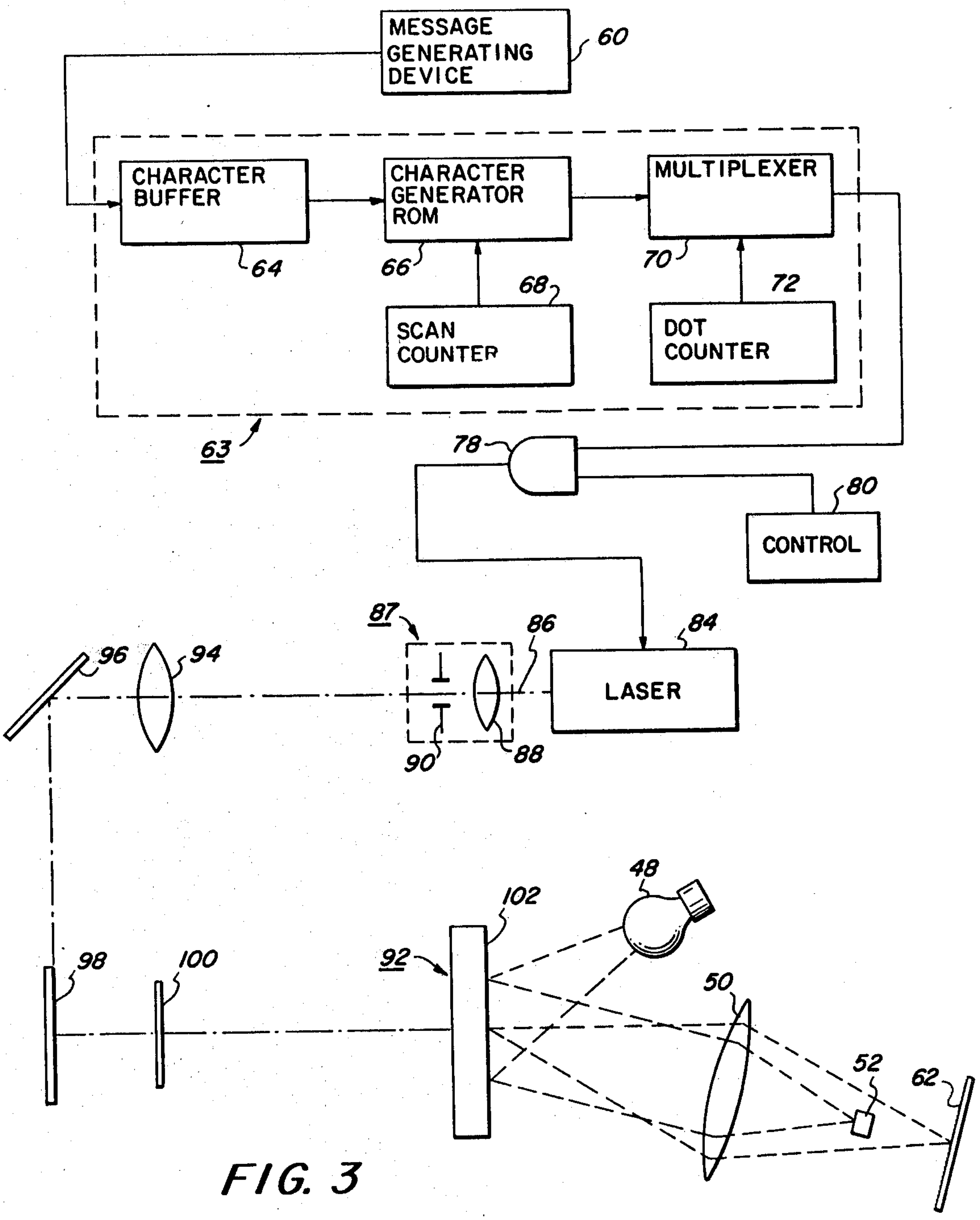
FIG. 3 is a schematic diagram of a laser addressed display system for selectively writing or editing images formed on the surface of the device shown in FIG. 1.

Referring now to FIG. 3, a block diagram of the display system of the present invention is shown. The system, in general, may display a message typed by an operator or provided by a data processing apparatus which assembles, stores and forwards text data generated by a source of page text data, such as derived, for example, from a magnetic card or tape reading device, onto a display device, such as a projection screen. As used herein, the term "characters" is meant to include a variety of visual symbols, including but not limited to vectors and alphanumeric symbols. Since the present invention is mainly directed to the erasure and editing of information (images) formed on an image recording device, only a brief description of the word processing features shown in FIG. 3 will be set forth. A message generating device 60, such as a computer or other data entry device, is utilized to display desired information on projection screen 62. The information from device 60 is read into a control unit 63, represented by the dashed lines, which in essence converts the coded information from device 60 into a video signal which controls a scanning laser to write the information on an image recording device. Control unit 63 comprises a character buffer 64 in which the information from device 60 is read by well known techniques, the output therefrom being coupled to a character generator ROM 66 which operates to provide the necessary binary dot pattern control of laser 84 in order to reproduce the message and/or page text.

The dot matrix in character generator ROM 66 corresponds to a line of text stored in character buffer 64, each character of the line comprising a 8 column, 16 row matrix. Each row of the character line in character generator ROM 66 is scanned by scan counter 68. Although illustrated as only having one output lead, scan counter 68 actually has four lines which allows the selection of up to 16 rows. The output of character generator ROM 66 is coupled to multiplexer 70 over eight output lines (only one illustrated), dot counter 72 controlling multiplexer 70 in a manner whereby one of the eight output lines (corresponding to eight columns of each character) is selected to be coupled to lead 76. The specific circuitry for reading out the desired character from character generator ROM 66 is not set forth in detail since it is a well known technique. Suffice to say that the desired digital signal, corresponding to the information to be recorded and displayed, is generated on lead 76. The output on lead 76 is coupled to one input of AND gate 78, the other input of which is coupled to a control device 80. Control device 80 is provided to synchronize the information generated by character generator ROM 66 via multiplexer 70 with the position of a scanning laser beam as will be described hereinbelow. The output of AND gate 78 is coupled to laser 84 and controls the output beam therefrom in a manner wherein desired information can be written on a medium sensitive to the laser beam. The output beam 86 of laser 84 is applied to a spatial filter 87 comprising lens 88 and aperture stop 90. The diameter of the scanning beam (image of the pinhole aperture 900 is imaged onto the rear surface of image recording device 92 via a scanning optical system which comprises an imaging lens 94, a folding mirror 96, and $y$ scan and $x$ scan mirrors 98 and 100, respectively. Image recording device 92, sensitive to the laser beam 86 and identical to device 10 shown in FIGS. 1 and 2, has a voltage applied across its electrodes (not shown) and the information on surface 102 is projected onto screen 62 for extended periods of time by the readout system comprising readout lamp 104, lens 106 and stop 108 as described hereinabove with reference to FIG. 2. The information, or message, can be selectively erased or updated as set forth hereinafter. The scan mirrors 98 and 100 comprise two moving-iron galvonometer driven mirrors which are used to deflect the laser beam in an $x$ and $y$ direction, respectively. The mirror 96 is used to fold the optical path for purposes of convenience.

A closed loop servo-feedback control system (not shown) may be used in the x-scanner drive to provide critical damping of mirror oscillations caused by delayed drive pulses and variable drive amplifier impedance. Laser 84, in the preferred embodiment comprises a 0.6 mw modulatable He-Ne laser which provides a red laser beam.

In operation, one line of data is read into character buffer 64 at a time from device 60. The character generator ROM 66, responsive to the character line in buffer 66, internally selects an 8 column, 16 row dot matrix for each character in the line (each character formed by the laser therefore comprises 16 scan lines, or alternately, each scan line comprises 16 rows). Scan counter 68 initially causes the first row of each character in the line to be scanned. Dot counter 72 via multiplexer 70 selects the column of the first row of the character line to be read out, the second column of the first row and so on until all eight columns of the first line character are read out. Scan counter 68 is thereafter reset so that the eight columns of the second line character are read out. This is repeated until all the columns in the line are scanned. As the video output is generated on lead 76 to synchronously control the blanking and unblanking of laser 84, laser beam 86 is being positioned to correspondingly scan the device 92. After the first row of the character line is scanned, scan counter 68 enables the second row of the character line to be scanned column by column as set forth hereinabove with regards to the first row. This is repeated until all sixteen rows of the character line are read out. As the first character line is being scanned, the second character line is read into character buffer 64 and the second character line is thereafter read in character generator ROM 66 and converted into a video signal in the same manner as described hereinabove. The procedure is repeated until all the character lines in the message to be displayed are read out and displayed on screen 62. Central control means 80 controls the various functions and vertical synchronization and horizontal synchronization signals are used to synchronize data modulation with the position of the scanning laser beam.

In the normal imaging mode, small mirror 108 acts as a zero order stop (positive spatial filter). A positive image is formed by the diffracted orders which pass around stop 108. In this mode, the system produces high contrast bright characters on a dark background. A negative image can be formed by tilting device 92 so that the zero order light is not blocked by stop 108 and by blocking the higher orders or by utilizing a different spatial filter.

Figure 4:
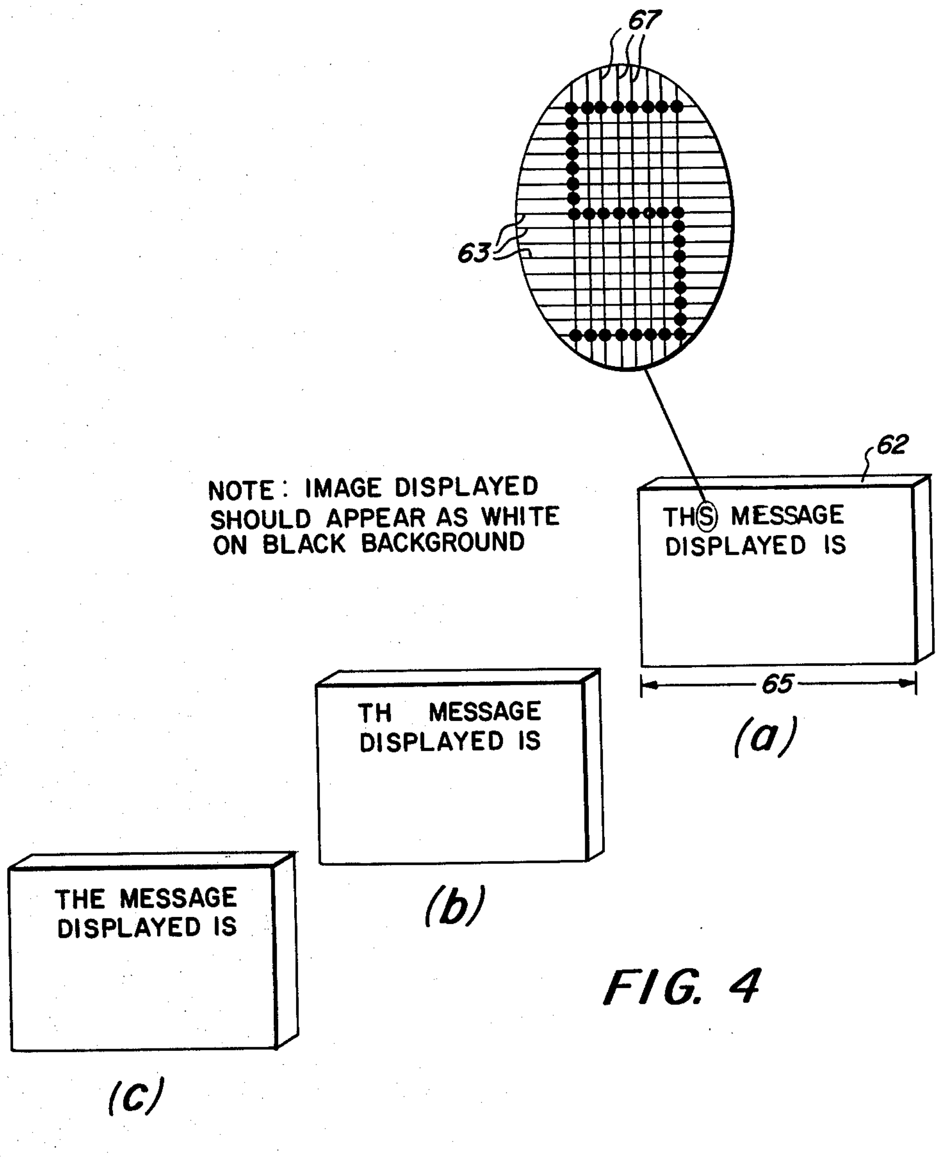
FIG. 4, consisting of *a, b* and *c,* illustrates the operation of the present invention.

FIGS. 4(a)–(c) illustrate the display of a typical message on the screen 62 of FIG. 3, the erasure of a particular character in that message and the addition of a new character in the area in which the character was erased, respectively. In particular, FIG. 4(a) shows a positive message (white letters on a dark background) formed on screen 62, the symbols thereon being arranged in scan lines 63 of text that read along the short page dimension 65, laser beam 86 generating the columnar segments 67 for each character, with the word "THE" misspelled. By removing the device bias, shorting the electrodes, scanning the laser beam in the area of the photoconductor which corresponds to the letter "S", and reapplying the biasing voltage, the resulting image projected on screen 62 is shown in FIG. 4(b). The letter "E" is inserted into the message by positioning the laser beam at the area of the phototconductor which corresponds to the erased area on the screen, applying the bias voltage and then causing the scanning laser beam to scan the device 92 in a pattern to form the letter "E" in accordance with control signals provided by device 60.

The number of scanning spots/line, scanning spots/letters, margins, scanning lines/frame, front style, etc. are determined by data processing circuitry using standard techniques. In a similar manner, the selective erasure technique described hereinabove can be utilized to selectively erase, or edit, parts of letters by appropriate control of the scanning laser beam.

While the invention has been described with reference to its preferred embodiment, it will be understood by those skilled in the art that various changes may be made and equivalents may be substituted for elements thereof without departing from the true spirit and scope of the invention. In addition, many modifications may be made to adapt a particular situation or material to the teachings of the invention without departing from its essential teachings.

What is claimed is:

1. A method for selectively erasing information formed on a surface of an image recording device, said information being in the form of deformations on said surface, comprising the steps of:

a. providing an image recording device comprising a first conductive layer, a layer of photoconductive material adjacent said first conductive layer, an electric field deformable elastomer layer adjacent said layer of photoconductive material and a deformable conductive layer adjacent said elastomer layer,
b. subjecting said image recording device to an electric field,
c. generating radiation to which the photoconductive layer is responsive,
d. modulating said radiation in accordance with information to be formed on said elastomer layer as deformations,
e. directing said information modulated radiation to said image recording device to thereby deform said elastomer layer corresponding to changes in the electric field caused by said information modulated radiation,
f. removing the electric field applied to said recording device,
g. creating a short-circuit condition between said first conductive layer and said deformable conductive layer, and
h. directing said radiation to selected areas of said image recording device whereby the deformations created on said elastomer layer which correspond to said selected areas are erased.

2. The method as defined in claim 1 further including the step of removing said short circuit condition and reapplying said electric field to said image recording device whereby the deformations on said elastomer layer, other than those which have been erased, are restored.

3. The method as defined in claim 2 further including the step of illuminating said image recording device with readout radiation to optically construct an image of the restored surface deformations on said elastomer layer.

4. The method as defined in claim 3 wherein said information modulated radiation and said readout radiation include radiation of different wavelengths.

5. The method as defined in claim 4 wherein said radiation is generated by a laser.

6. The method as defined in claim 2 further including the step of directing said information modulated radiation to said image recording device in the areas thereof which correspond to the areas of the elastomer layer which have been erased whereby deformations created by said information modulated radiation are formed on said elastomer layer in said selected areas.

7. The method as defined in claim 6 further including the step of illuminating said image recording device with readout radiation to optically construct an image of the surface deformations on said elastomer layer.

8. The method as defined in claim 1 wherein said first conductive layer comprises a transparent conductive substrate for supporting the layers of said image recording device.

9. The method as defined in claim 8 wherein said information modulated radiation is directed to said image recording device through said transparent conductive substrate.

10. The method as defined in claim 9 wherein said radiation is directed to said image recording through said transparent conductive substrate.

11. The method as defined in claim 3 wherein said deformable conductive layer is of an optical density sufficient to prevent exposure of said photoconductive layere to said readout radiation.

12. The method as defined in claim 7 wherein said deformable conductive layer is of an optical density sufficient to prevent exposure of said photoconductive layer to said readout radiation.

13. A system for selectively erasing information formed on a surface of an image recording device, said information being in the form of deformation on said surface comprising:

an image recording device comprising a first conductive layer, a layer of photoconductive material adjacent said first conductive layer, an electric field deformable elastomer layer adjacent said layer of photoconductive material and a deformable conductive layer adjacent said elastomer layer, means for applying an electric field to said image recording device, means for generating radiation to which the photoconductive layer is responsive, means for modulating said radiation in accordance with information to be formed on said elastomer layer as deformations, means for directing said information modulated radiation to said image recording device to thereby deform said elastomer layer corresponding to changes in the electric field caused by said information modulated radiation, means for removing the electric field applied to said image recording device, and means for creating a short-circuit condition between said first conductive layer and said deformable conductive layer, said directing means directing said radiation to selected areas of said image recording device whereby the deformations created on said elastomer layer which corresponds to said selected areas are erased.

14. The system as defined in claim 13 wherein said short-circuit condition is removed and said electric field is reapplied to said image recording device whereby the deformations on said elastomer layer, other than those which have been erased, are restored.

15. The system as defined in claim 14 further including means for illuminating said image recording device with readout radiation to optically construct an image of the restored surface deformations on said elastomer layer.

16. The system as defined in claim 15 wherein said information modulated radiation and said readout radiation includes radiation of different wavelengths.

17. The system as defined in claim 16 wherein said radiation is generated by a laser.

18. The system as defined in claim 14 wherein information modulated radiation is directed to said image recording device in the areas thereof which correspond to the selected areas of the elastomer layer which have been erased whereby deformations created by said information modulated radiation are formed on said elastomer layer in said selected areas.

19. The system as defined in claim 18 further including means for illuminating said image recording device with readout radiation to optically construct an image of the surface deformations on said elastomer layer.

20. The system as defined in claim 13 wherein said first conductive layer comprises a transparent conductive substrate for supporting the layers of said image recording device.

21. The system as defined in claim 20 wherein said information modulated radiation is directed to said image recording device through said transparent conductive substrate.

22. The system as defined in claim 15 wherein said deformable conductive layer is of an optical density sufficient to prevent exposure of said photoconductive layer to said readout radiation.

23. The system as defined in claim 19 wherein said deformable conductive layer is of an optical density sufficient to prevent exposure of said photoconductive layer to said readout radiation.

24. The system as defined in claim 13 further including means for controlling said directing means in a manner whereby said image recording device is scanned in a predetermined scan pattern whereby the deformations in said elastomer layer conform to said predetermined scan pattern, said deformations being produced by said information modulated radiation.

25. The system as defined in claim 24 wherein said information modulated radiation comprises a laser beam the intensity of which is controlled in accordance with the information to be formed as deformations on said elastomer layer.

26. The system as defined in claim 25 wherein said controlling means controls said directing means in a manner whereby said radiation is directed to said selected areas of said image recording device, whereby the deformations created on said elastomer layer which correspond to said selected areas are erased.

* * * * *